(12) United States Patent  
Burrell et al.

(10) Patent No.: US 7,867,820 B2  
(45) Date of Patent: *Jan. 11, 2011

(54) METHODS FOR FORMING CO-PLANAR WAFER-SCALE CHIP PACKAGES

(75) Inventors: Lloyd G. Burrell, Poughkeepsie, NY (US); Howard Hao Chen, Yorktown Heights, NY (US); Louis L. Hsu, Fishkill, NY (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 168 days.

This patent is subject to a terminal disclaimer.

(21) Appl. No.: 12/121,468

(22) Filed: May 15, 2008

(65) Prior Publication Data

US 2008/0280399 A1    Nov. 13, 2008

Related U.S. Application Data

(63) Continuation of application No. 10/994,494, filed on Nov. 20, 2004, now Pat. No. 7,405,108.

(51) Int. Cl.  
*H01L 21/00* (2006.01)
(52) U.S. Cl. .................. 438/107; 438/113; 438/114; 257/E21.122
(58) Field of Classification Search .......... 438/108, 438/125, 455, 456, 459, 462, 464, 977, 107, 438/113, 114; 257/E21.122, E23.131  
See application file for complete search history.

(56) References Cited

U.S. PATENT DOCUMENTS

| | | | |
|---|---|---|---|
| 4,866,501 A * | 9/1989 | Shanefield | ........... 257/684 |
| 4,907,062 A | 3/1990 | Fukushima | |
| 5,091,331 A | 2/1992 | Delgado et al. | |
| 5,324,687 A | 6/1994 | Wojnarowski | |
| 5,866,443 A | 2/1999 | Pogge et al. | |
| 6,001,740 A | 12/1999 | Varian et al. | |
| 6,177,299 B1 | 1/2001 | Hsu et al. | |

(Continued)

FOREIGN PATENT DOCUMENTS

WO    WO 02/084721    10/2002

OTHER PUBLICATIONS

English Abstract for Publication No. WO 02/084721, Oct. 24, 2002.

(Continued)

*Primary Examiner*—Khiem D Nguyen

(57) ABSTRACT

Economical methods for forming a co-planar multi-chip wafer-level packages are proposed. Partial wafer bonding and partial wafer dicing techniques are used to create chips as well as pockets. The finished chips are then mounted in the corresponding pockets of a carrier substrate, and global interconnects among the chips are formed on the top planar surface of the finished chips. The proposed methods facilitate the integration of chips fabricated with different process steps and materials. There is no need to use a planarization process such as chemical-mechanical polish to planarize the top surfaces of the chips. Since the chips are precisely aligned to each other and all the chips are mounted facing up, the module is ready for global wiring, which eliminates the need to flip the chips from an upside-down position.

8 Claims, 13 Drawing Sheets

U.S. PATENT DOCUMENTS

| | | |
|---|---|---|
| 6,555,906 B2 | 4/2003 | Towle et al. |
| 6,964,881 B2 * | 11/2005 | Chua et al. .................. 438/108 |
| 7,005,319 B1 * | 2/2006 | Chen et al. .................. 438/107 |
| 7,203,393 B2 | 4/2007 | Rajan et al. |
| 7,405,108 B2 * | 7/2008 | Burrell et al. ............... 438/125 |
| 2003/0205796 A1 * | 11/2003 | Hakey et al. ................ 257/678 |
| 2003/0216010 A1 | 11/2003 | Atlas |
| 2005/0116337 A1 | 6/2005 | Chua et al. |
| 2006/0035443 A1 | 2/2006 | Hsu et al. |

OTHER PUBLICATIONS

International Search Report dated Reb. 23, 2006, PCT/EP2005/056009.

* cited by examiner

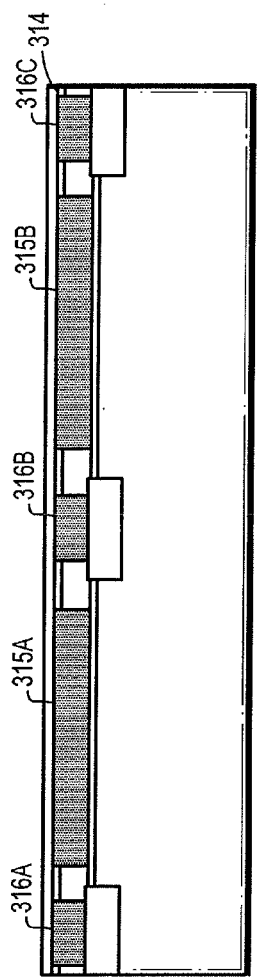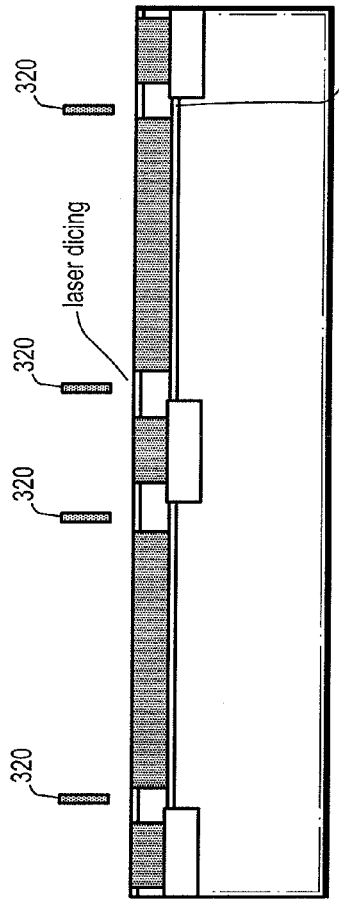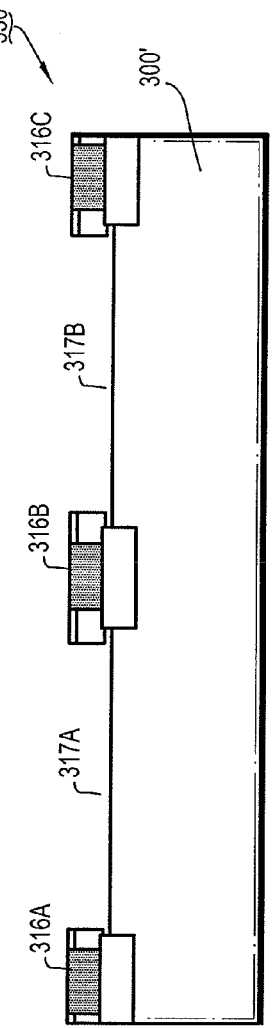

METHODS FOR FORMING CO-PLANAR WAFER-SCALE CHIP PACKAGES

CROSS-REFERENCE TO RELATED APPLICATION

This is a Continuation Application of U.S. patent application Ser. No. 10/994,494, filed Nov. 20, 2004, now issued as U.S. Pat. No. 7,405,108, the disclosures of which are herein incorporated by reference in their entirety.

TECHNICAL FIELD OF THE INVENTION

The present invention relates generally to a multi-chip wafer level package, and more particularly, to methods for forming a multi-chip wafer-level packages using partial wafer bonding and partial wafer dicing techniques.

BACKGROUND

A fundamental limit that prevents the scaling of CMOS (complimentary metal oxide) semiconductor processes beyond the physical dimensions of atoms has resulted in an increase in the importance of a low-cost, high-performance multi-chip packages for the design of VLSI (very large scale integrated) circuits. In an embedded system-on-a-chip (SoC) design, different memory and logic circuits on the same substrate often require different processing steps. For example, nonvolatile flash memory uses double poly-silicon floating gates with an ultra thin tunnel oxide, which are not compatible with the conventional CMOS processes for fabricating logic circuits.

In addition, it is difficult to integrate chips that are fabricated on different substrate materials, such as silicon, glass, silicon carbide (SiC), gallium arsenide (GaAs), and other compounds of groups III-V. The integration of specific integrated circuits (ASIC) with devices such as magnetic random access memory (MRAM) and micro-electro-mechanical systems (MEMS) presents further challenges in the design of multi-chip packages.

For example, in a two-dimensional multi-chip package, chips are placed horizontally on a carrier and global interconnects are formed on top of the chips, or on a second-level package. However, due to the variation of chip thickness, it is often necessary to planarize the bonded chip surface, and the gaps between the chips and the surrounding areas. Without a flat surface, interconnect processes based on a Damascene method cannot be properly preformed on a bonded chip surface. Furthermore, without critical alignment control, each carrier will need to have a customized mask set to form global interconnects, which increases the manufacturing cost.

Further, in a three-dimensional stacked-chip package where two or more chips are stacked vertically, interconnections among stacked chips are formed at the edges of each chip using a wire bond or a tag bond. Stacked chips that are used in portable devices must be thinned down in order to fit into the limited space available. As the number of stacked chips increases, the thickness of the chips must be reduced. The number of chips that can be stacked is determined by the maximum available space and the minimum chip thickness.

Therefore, a need exists for economical and cost effective method of forming a multi-chip wafer-level chip packages without the need for planarizing a bonded chip surface in order to form global interconnects and for facilitating the integration of chips fabricated by different processing steps and with different materials.

SUMMARY OF THE INVENTION

Exemplary embodiments of the present invention include methods for forming multi-chip wafer-level chip packages without the need for planarizing a bonded chip surface to form global interconnects and for facilitating the integration of chips fabricated by different processing steps and with different materials.

An exemplary embodiment relates to a method of forming a multi-chip wafer-level package. The method includes forming a plurality of different-type chips on a plurality of chip substrates, wherein each of the plurality of chip substrates is used to form only one-type of chip, detaching said plurality of different-type chips from said plurality of chip substrates, forming pockets in a carrier substrate, wherein each of the pockets holds one of said plurality of different-type chips, and mounting said plurality of chips into their corresponding pockets in the carrier substrate such that a top surface of said plurality of chips is substantially co-planar with a top surface of the carrier substrate. The different-type chips may be Memory chips, Logic chips, MEMs devices, RF circuits or passive devices.

The step of forming a plurality of the chips on a plurality of chip substrates may also include bonding a wafer to STI (shallow trench isolation) regions in each of the chip substrates such that voids are formed adjacent to the STI regions and between the wafer and a chip substrate, wherein areas in the wafer above the STI regions define inter-chip areas and areas in the wafer above the void define chip areas. In addition, a discrete device may be formed in the inter-chip areas of the chip substrate, wherein the discrete device may be an inductor, a decoupling capacitor, or electrostatic discharge (ESD) diode.

In the method above, before bonding the wafer to the STI regions, the method may also include patterning a dielectric layer on the chip substrate, etching the pattern dielectric layer to define off-chip areas, forming STI regions in the off-chip areas, and removing the dielectric layer between the off-chip areas.

The method may also include thinning said wafer, forming devices in said thinned wafer, forming BEOL (Back-End-Of-Line) interconnects on said thinned wafer, and forming finishing devices and interconnects in the chip areas to complete the formation of said plurality of chips.

The step of detaching said plurality of chips from said plurality of chip substrates may also include coating a top surface of said thinned wafer with a passivation layer, and dicing, or etching, a channel through the chip areas of said thinned wafer to the voids, thereby detaching said plurality of chips from said plurality of chip substrates.

The step of forming pockets in the carrier substrate may also include bonding a wafer to STI regions in the carrier substrate such that voids are formed adjacent to the STI regions and between the wafer and the carrier substrate, wherein areas in the wafer above the STI regions define inter-chip areas and areas in the wafer above the voids define chip areas.

The step of mounting said plurality of chips into their corresponding pockets may also include depositing a dielectric layer in the chip areas having a substantially same thickness as the voids, and aligning said plurality of chips within their corresponding pockets.

Another exemplary embodiment relates to a method of forming a multi-chip wafer level package. The method includes forming a plurality of same or different-type chips on a corresponding chip substrate, detaching said plurality of chips from said corresponding chip substrate, forming a plurality of pockets on a carrier substrate such that each of the plurality of pockets holds a predetermined-type chip, selecting chips from the plurality of same or different-type chips that correspond to the predetermined-type chips for each of the plurality of pockets, and mounting the selected chips into their corresponding pocket such that a top surface of the selected chips is substantially co-planar with a top surface of the carrier substrate.

These and other exemplary embodiments, features, aspects, and advantages of the present invention will be described and become more apparent from the detailed description of exemplary embodiments when read in conjunction with accompanying drawings.

BRIEF DESCRIPTION OF THE DRAWINGS

FIGS. 3A-3L illustrate a method for forming multi-chip wafer-scale package, according to an exemplary embodiment of the present invention.

DETAILED DESCRIPTION OF EXEMPLARY EMBODIMENTS

Figure 1A:
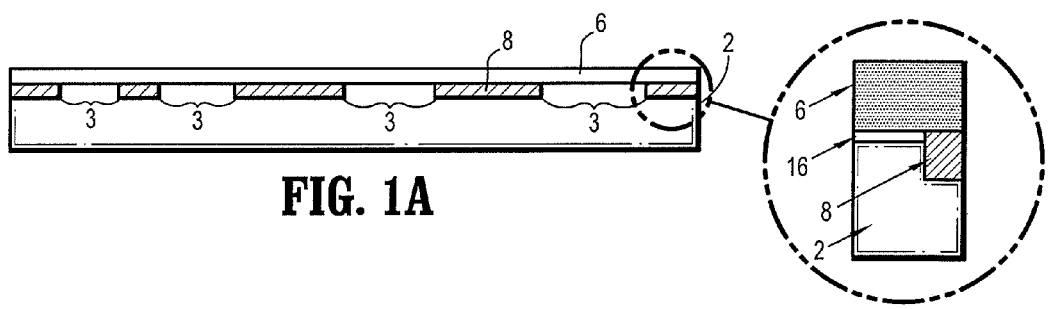
FIGS. 1A-1E illustrate a method for forming a multi-chip wafer package, according to an exemplary embodiment of the present invention.

Exemplary embodiments of the invention as described herein provide low-cost methods for fabricating multi-chip wafer-level packages, where both chips and carrier are formed using "partial wafer bonding" and "partial wafer dicing" techniques. In accordance with exemplary embodiments of the present invention, in general, the use of partial wafer bonding allows the formation of chips in an unbonded area of a thin silicon layer on a wafer carrier and the formation of pockets in an unbonded area of a top thin silicon layer on a carrier substrate. During a chip integration process, chips are diced out of a wafer carrier using a partial dicing technique, and the pocket is formed on a carrier substrate using the same partial wafer dicing technique. Finally, the chips from the same or different wafer carriers are placed and bonded into their corresponding pockets.

FIGS. 1A-1E illustrate a method for forming a multi-chip wafer package, according to an exemplary embodiment of the present invention. More particularly, FIGS. 1A-1E illustrate a process of forming pockets in a carrier substrate 2 ("cs") and placement of chips within the pockets of the carrier substrate, according to an exemplary embodiment of the present invention, Referring to FIG. 1A, a silicon layer 6 for forming pockets at a surface of the carrier substrate 2 is partially bonded at oxide sites 8 of the carrier substrate 2. In addition, the silicon layer 6 is not bonded to the carrier substrate 2 at non-oxidized areas 3, thereby forming a microscopic void 16 (as depicted in the exploded portion of FIG. 1A) in the non-oxidized areas 3 below the silicon layer 6. Further, the void 16 includes air or a nitride layer. Furthermore, a CVD nitride film may be deposited and patterned so that the void 16 includes a nitride film. In short, a microscopic void, a CVD nitride film, or a roughened surface prevents bonding at a surface of a carrier substrate.

Referring to the exploded view of a portion of FIG. 1A, the exploded view shows the carrier substrate 2 including a shallow trench isolation, STI, region 8, the silicon layer 6, a portion of the void 16 formed between the silicon layer 6 and the carrier substrate 2 and adjacent to the STI region 8. Preferably, the void 16 comprises air, a nitride layer, or a roughened silicon surface to prohibit bonding.

Figure 1B:
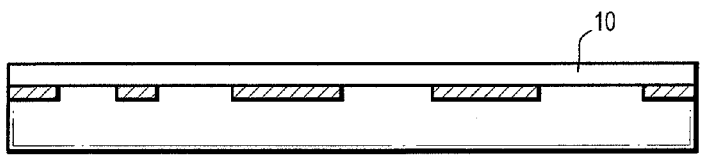
Figure 1C:
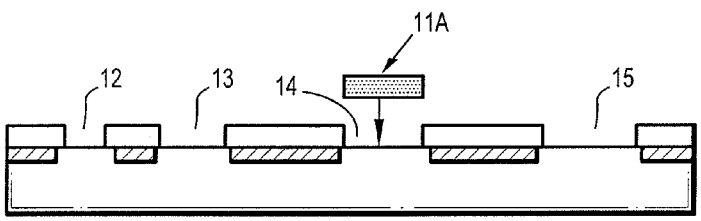

Next, a conventional metallization process is then carried out on the silicon layer 6 in FIG. 1B, thereby forming an interconnect layer 10. Then, pockets (12, 13, 14, and 15) of FIG. 1C are formed in the carrier substrate 2. A partial wafer dicing technique is used to form the pockets in the carrier substrate 2.

Figure 1D:
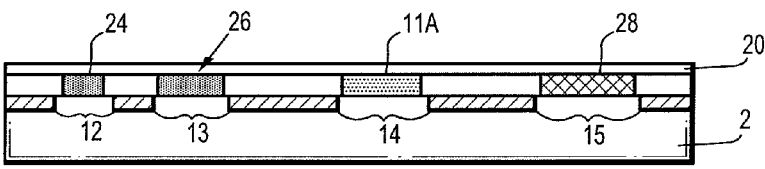
Figure 1E:
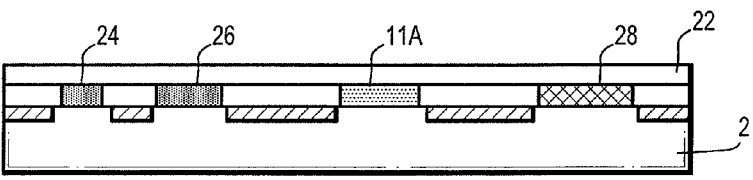

FIGS. 1D and 1E illustrate a transfer of chips 11A, 24, 26 and 28 from multiple dummy carriers into their corresponding pockets 12-15 in a carrier substrate 2. It is to be understood that chips 11A, 24, 26, and 28 represent different types of chips, wherein each type of chip is formed on a separate carrier substrate. Further, an insulating layer 20 may be deposited on the carrier substrate 2 to hold multiple chips from different dummy carriers in place, to fill gaps that may be present between a chip and the STI regions 8, and to provide a planarize top surface so that a global interconnect 22 can be formed on the carrier substrate 2 as shown in FIG. 1E.

Figure 2A:
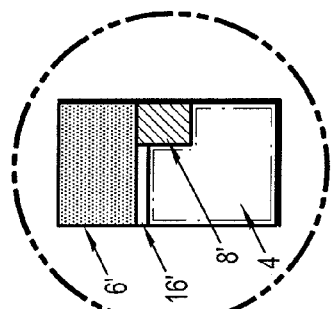
FIGS. 2A-2C illustrate a method of forming chips on a dummy carrier, according to another exemplary embodiment of the present invention.
Figure 2A:
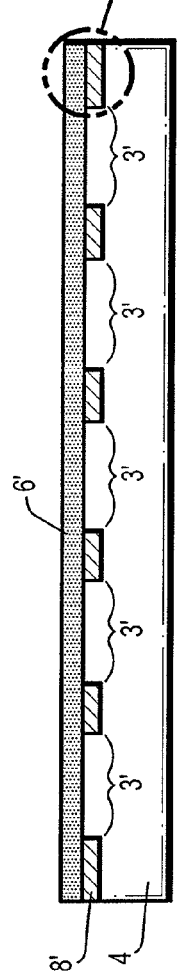
Figure 2B:
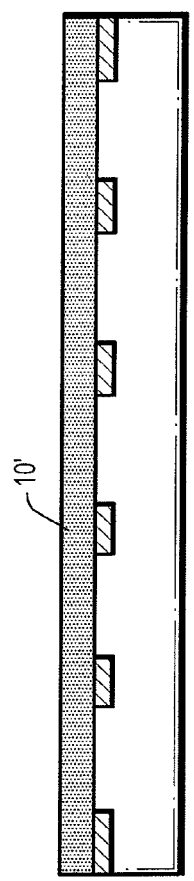
Figure 2C:
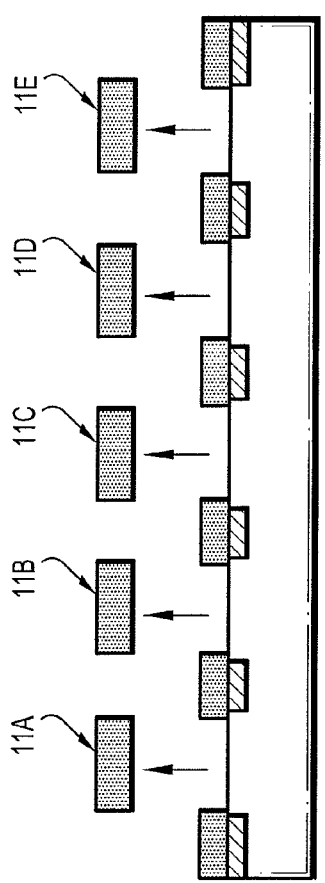

FIGS. 2A-2C illustrate a method of forming chips on a dummy carrier, according to another exemplary embodiment of the present invention. Referring to FIG. 2A, a semiconductor layer 6' for forming chips is partially bonded to a dummy carrier 4 at the STI regions 8'. The semiconductor layer 6' can be silicon, germanium, gallium arsenide, CdSe, a compound of a group II element and a group IV element, or a compound of a group III and a group V element. In other words, different material may be used to form different chips. After dicing chips 11A-11E out from the dummy carrier 4, at least one of the chips, e.g. chip 11A, can be assembled into its corresponding pocket (e.g., pocket 14) of the carrier substrate 2. Here, only one dummy carrier 4, or s1, is shown; however, it is to be understood that there may be many other dummy carriers with the same or different semiconductor layers to produce many different types of chips, e.g., memory chips, logic circuits, MEMs devices, RF circuits, or passive devices. Further, as shown in FIG. 2B, each dummy carrier could produce a plurality of identical chips 11A-11E. It is to be understood that although the devices 11A-11E shown in FIG. 2B have a rectangular shape, chips 11A-11E may be formed having many different shapes, e.g., square, polygon, u-shaped, v-shaped, etc. In addition, chips 11A-11E may be formed having a same shape of varying sizes. For example, chips 11A-11E may be capacitors having a rectangular shape of varying lengths.

In addition, the semiconductor layer 6' is not bonded to the dummy carrier 4 at non-oxidized areas 3', thereby forming a void 16', as shown in the exploded view of FIG. 2A, at the non-oxidized areas 3'. Further, the void 16' may include air or a nitride layer. It should be noted that the use of a partial wafer bonding technique provides tighter control over the thickness of the silicon layer 6 and the semiconductor layer 6' in FIGS. 1A and 2A, respectively. In an expanded view of a portion of FIG. 2A, the dummy carrier 4 includes a shallow trench isolation, STI, region 8', the semiconductor layer 6', and a region 16' formed between the semiconductor layer 6' and the dummy carrier 4 and adjacent to the STI region 8'. Preferably, the region 16' comprises air, a nitride layer, or a roughened silicon surface to prohibit bonding.

Next, devices (not shown) are formed in the semiconductor layer 6' on the dummy carrier 4. A conventional metallization process is then carried out on the semiconductor layer 6' in FIG. 2B, thereby forming an interconnects layer 10' having about the same thickness as the interconnect layer 10 as shown in FIG. 1B. Then, the chips 11A-11E of FIG. 2C are detached from the dummy carrier 4. A partial wafer dicing technique is used to detach the chips 11A-11E from the dummy carrier 4. At least one of the chips 11A-11E, e.g., chip 11A, from the dummy carrier 4 is placed in its corresponding pocket, e.g., pocket 14, formed in the carrier substrate 2 of FIG. 1C. Each dummy carrier may have the same or a different semiconductor top layer 6'. However, within a dummy carrier, identical chips are produced. For example, a first dummy carrier s1 having silicon top layer may be used to produce a plurality of DRAM memory chips. A second dummy carrier s2 having magnetic top layer may be used to produce a plurality of MRAM chips. During assembly, at least one chip from each of the dummy carriers s1-sn may be placed into its corresponding pocket of a carrier substrate cs. For example, a MRAM chip from the second dummy carrier s2 and four (4) DRAM chips from the first dummy carrier s1 may be placed in their corresponding pockets of a carrier substrate cs during the assembly of a multi-chip wafer-level package.

It is important to apply the same process, including material deposition and thickness control, to both a carrier substrate cs having pockets and dummy carriers in which chips are produced thereon so that a pocket depth and a chip thickness can be matched. In other words, all the finished chips should have a substantially identical thickness equivalent to the depth of the pockets. Partial wafer dicing is carried out by using a mask and etching technique to precisely control the size and alignment between chips in their corresponding pockets. Each chip is then placed and glued in its corresponding pocket with a proper adhesive or thermal paste. This process does not require any additional steps of planarization or carrier transfer, as all chips are already facing up so that the formation of global interconnects to electrically connect the chips on a carrier substrate may be performed.

Further, a partial wafer dicing technique enables the cutting and removal of chips from a dummy carrier without breaking the dummy carrier. The chips are removed from the dummy carrier by partially cutting through a wafer, preferably just the top semiconductor layer on the dummy carrier. Since this area is not bonded to the dummy carrier, once the wafer is partially cut through, the chips are detached from the dummy carrier. In other words, the partial wafer dicing technique can only be performed when the wafer is partially bonded to the dummy carrier. The advantage of partial-bonding and partial-dicing is, once the chips are detached from their respective dummy carriers, the chips thickness will substantially match the pocket depth of the carrier substrate, thereby avoiding the need for a harsh polishing step.

Figure 3A:
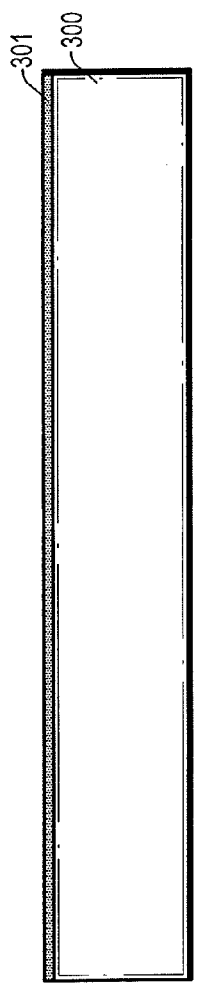
Figure 3B:
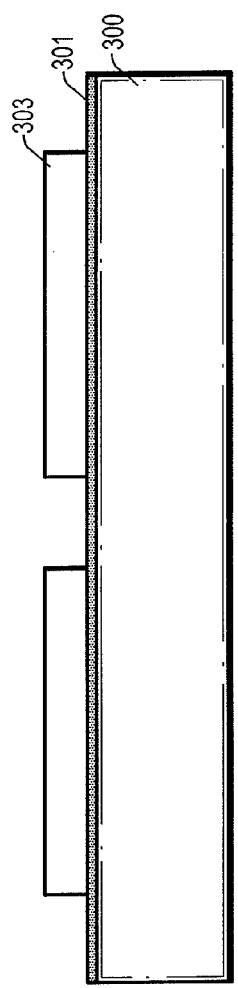
Figure 3C:
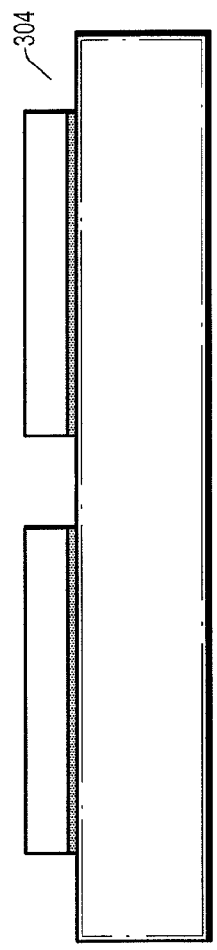
Figure 3D:
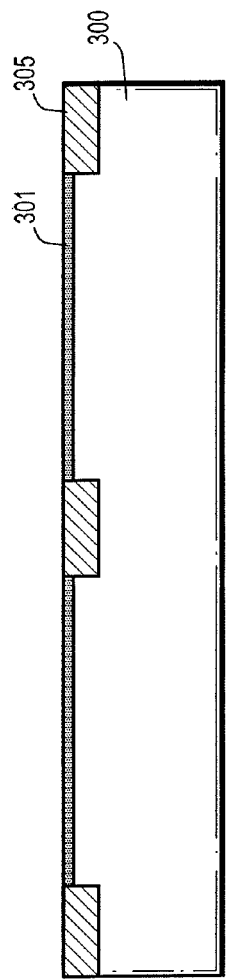
Figure 3E:
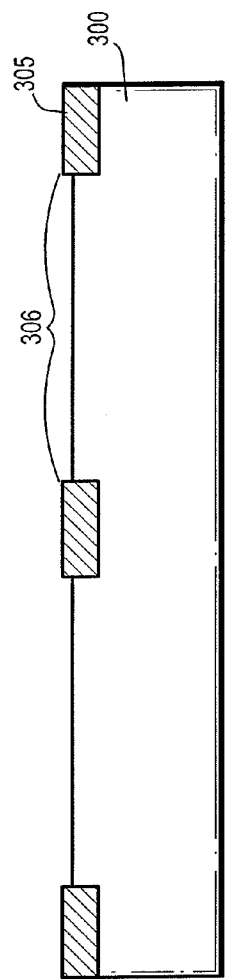
Figure 3F:
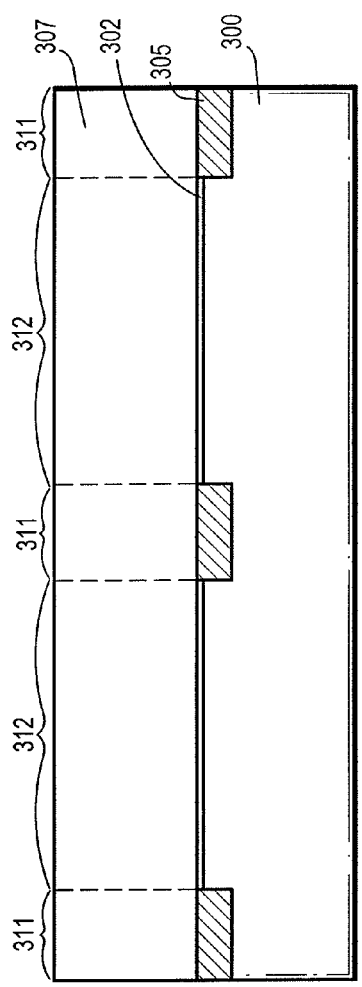
Figure 3G:
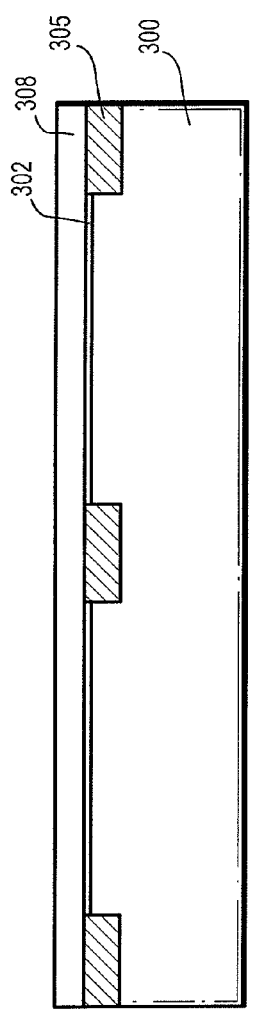
Figure 3H:
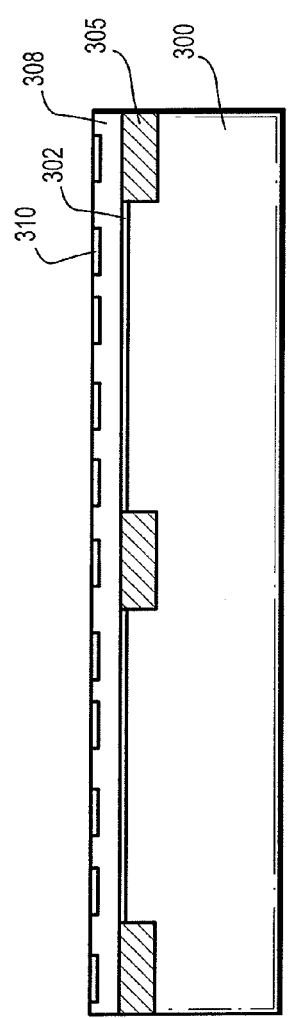
Figure 3I:
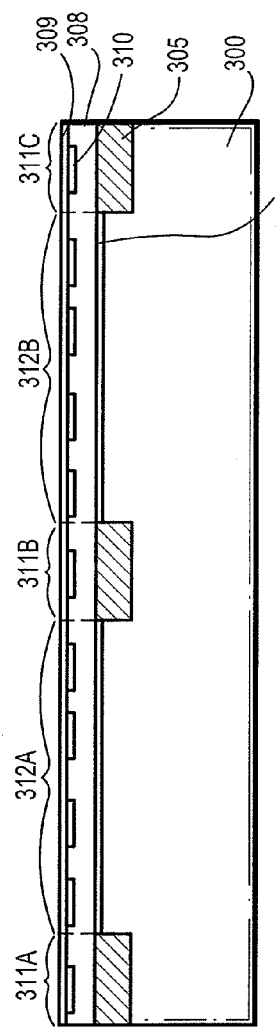

FIGS. 3A-3L illustrate a method for forming both chips and carrier for multi-chip wafer-scale packages according to an exemplary embodiment of the present invention. In FIG. 3A, a dielectric layer 301 is deposited on a top surface of a dummy carrier 300. The thickness of the dielectric layer 301 determines the depth of the void to be formed in a subsequent step. In FIG. 3B, the dielectric layer 301 is patterned by using a conventional lithographic method with a photoresist mask 303. In FIG. 3C, the dielectric layer 301 is etched by a dry etch process to define off-chip areas 304. The off-chip areas 304 will be used as a bonding site in a subsequent step. In FIG. 3D, shallow trench isolation (STI) regions 305 are formed in the off-chip regions 304. In FIG. 3E, the dielectric layer 301 is removed to form a gap region 306. In FIG. 3F, a wafer 307 is bonded to the dummy substrate 300 at the STI regions 305, thereby forming a void 302 in the gap region 306. The area above the void 302 in the wafer 307 defines a chip area 312, and the area in the wafer 307 above the STI regions 305 defines an inter-chip area 311. In FIG. 3G, the wafer 307 is thinned, thereby forming a thinned wafer 308. Preferably, the thickness of the thinned wafer 308 is about 50 to about 100 um. This thinning technique and thickness control has been fully established and thus will not be described further. In FIG. 3H, devices 310 are formed inside the thinned wafer layer 308. In FIG. 3I, BEOL, or Back-End-Of-Line, interconnects 309 are formed on the thinned wafer layer 308. Further, a discrete device may be formed in the inter-chip areas 311 of the thinned wafer layer 308 of the dummy carrier 300. The discrete device may include an inductor, a decoupling capacitor, an electrostatic discharge (ESD) diodes, or any other discrete device. That is, prior to cutting out of chips 315A and 315B, these discrete devices reside in the inter-chip areas and may be utilized for testing and monitoring the workings of the chips formed therein. Further, after the formation of the BEOL interconnects 309, the chip areas 312A and 312B are filled with finished devices and interconnects, not shown, to complete the formation of chips 315A and 315B, as shown in FIG. 3J.

Figure 4A:
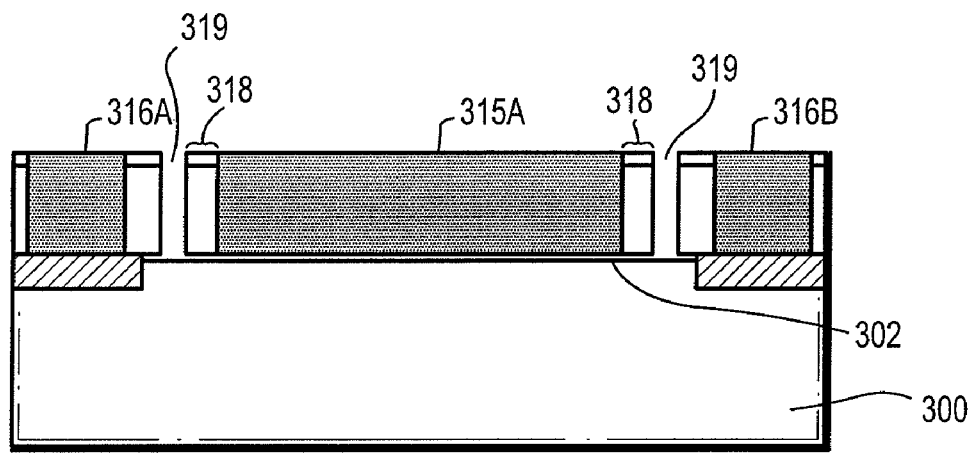
FIG. 4A is a side view of a chip as shown in FIG. 3K after a partial wafer dicing technique has been performed.

Referring to FIG. 3J, a passivation layer 314 is coated on a top surface of the thinned wafer layer 308 to prepare the wafer for dicing. Since the thinned wafer layer 308 is thin, it is possible to use a laser dicing technique or reactive ion etching to cut and detach the chips 315A and 315B from the thinned wafer layer 308 by cutting a channel 319, as shown in FIG. 4A, around the chips 315A and 315B. Preferably, the channel width is about 15 um to about 40 um. FIG. 3K shows a desirable location 320 for dicing through the thinned wafer layer 308 to the void 302, thereby detaching the chips 315A and 315B from the thinned wafer layer 308. Further, the devices formed at the inter-chip areas of the dummy carrier, or chip carrier, may only be used for testing and monitoring chips formed therein because once the chips are removed from the dummy carrier, the dummy carrier becomes useless and will be discarded.

Furthermore, the above described process is also used to form pockets in a carrier substrate. In addition, the steps related to forming chips within the thin wafer are not performed with respect the carrier substrate. However, discrete devices may be formed in the inter-chip areas of the carrier substrate. The discrete devices may include an inductor, a decoupling capacitor, an electrostatic discharge (ESD) diodes, or any other discrete devices. That is, when the pockets are cut out, these discrete devices reside in the inter-chip areas so that these discrete devices may be utilized as part of a system after chips have been formed.

FIG. 3L illustrates a structure of a carrier substrate according to an exemplary embodiment of the present invention. More specifically, FIG. 3L shows a carrier substrate structure after dummy chips have been removed from the non-bonded areas of the carrier substrate. Now referring to FIG. 3L, after the dummy chips, not shown, are cut and detached from the carrier substrate 300', a structure 330 is formed comprising pockets 317A and 317B and prefabricated useful devices 316A, 316B, and 316C in the inter-chip areas 311.

It should also be noted that pockets and chips can be formed on different wafers at different times, and/or from different sources, since the process steps are identical, the thickness of the chips and depth of the pockets are closely tracked. Prior to dropping the chips into their corresponding pockets, a dielectric layer having the same thickness as the dielectric layer 301 of FIG. 3A must be deposited to fill the void 302. Preferably, the void 302 is filled with a dielectric layer, an adhesive layer, or a thermal paste prior to dropping the chips into their respective pockets. As a result, when all the chips are dropped into their corresponding pockets, a top surface of all the chips are substantially co-planar with a top surface of the wafer having the pockets, thereby decreasing the number of steps and processes required for forming a multi-chip wafer-level integration package. Furthermore, discrete devices formed in inter-chip areas of a dummy carrier are used for testing and monitoring the workings of chips formed thereon. Whereas, discrete devices formed in inter-chip areas of a carrier substrate are an integral part of a multi-chip wafer-level package.

FIG. 4A is a side view of a chip as shown in FIG. 3K after a partial wafer dicing technique has been performed. Referring to FIG. 4A, predetermined portions of the thinned wafer layer 308 have been removed by using a partial wafer dicing technique, thereby detaching the chip 315A from the carrier substrate 300. In addition, a buffer region 318 is defined around the chip 315A. It should be further noted here that a dicing technique is performed by dicing through the thinned wafer layer 308 to the void 302, thereby detaching the chip 315A from the substrate. In other words, since the chip 315A is not attached to the substrate at the void 302, the chip 315A is detached once the thinned wafer layer 308 is cut and diced around the chip 315A.

Figure 4B:
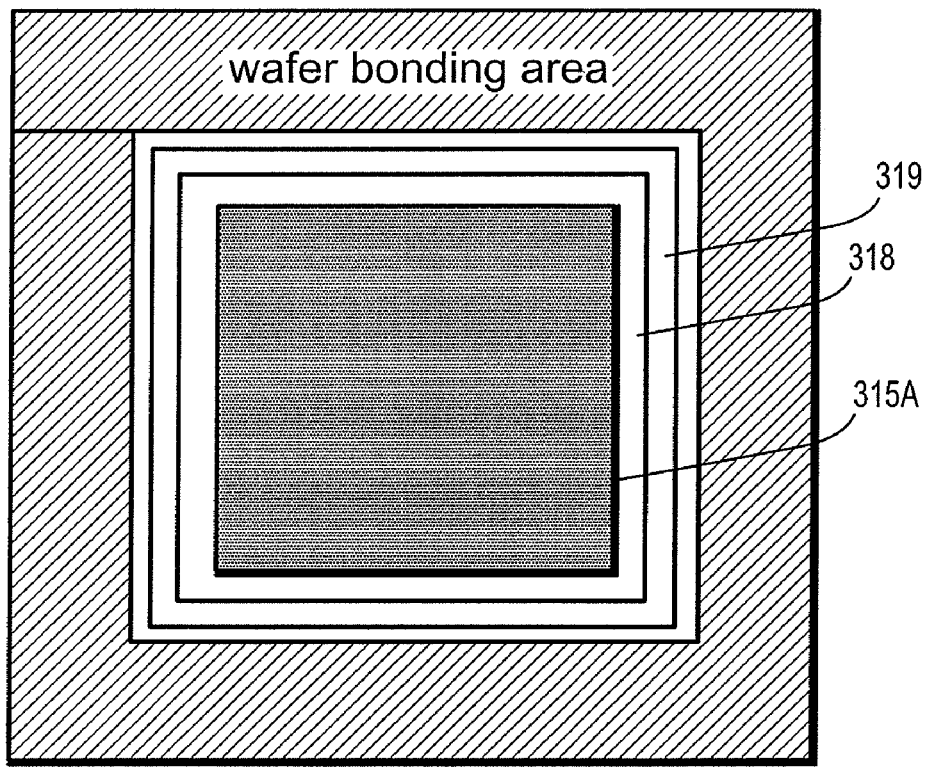
FIG. 4B is a top view of the chip as shown in FIG. 3K after a partial wafer dicing technique has been performed.

FIG. 4B is a top view of the chip as shown in FIG. 3K after a partial wafer dicing technique has been performed. Referring to FIG. 4B, chip 315A is show having a buffer region 318 along the outer perimeter of the chip 315A adjacent to the cutting channel 319.

Figure 5A:
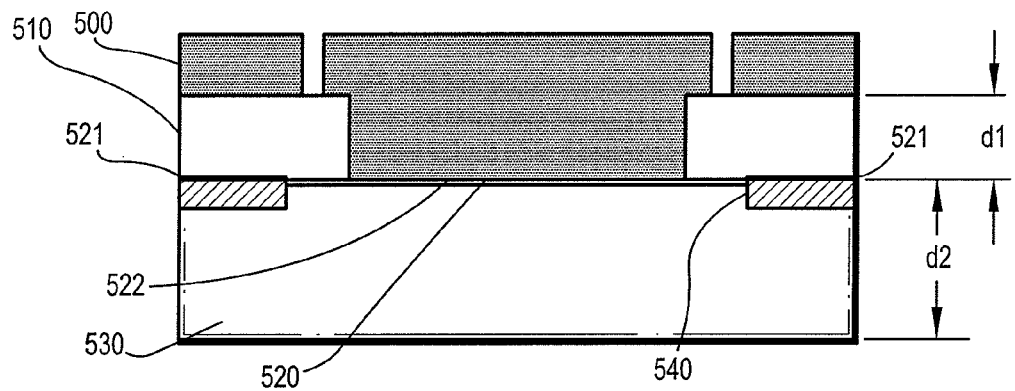
FIGS. 5A-5C illustrate a method for detaching a chip formed on a carrier substrate, according to an exemplary embodiment of the present invention.
Figure 5B:
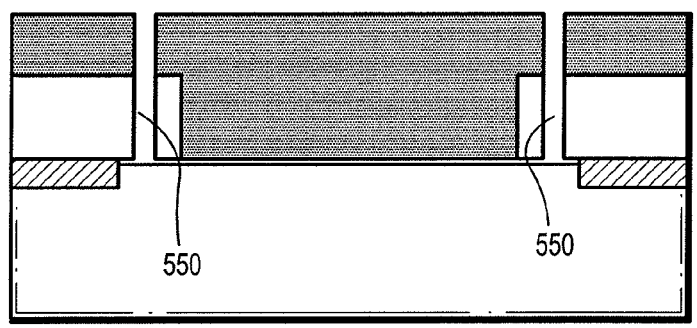
Figure 5C:
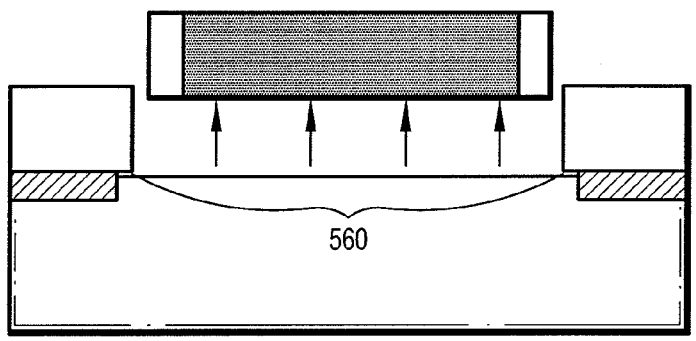

FIGS. 5A-5C illustrate a method for detaching a chip formed on carrier substrate according to an exemplary embodiment of the present invention. In FIG. 5A, a thin wafer layer 510 having a thickness d1 is bonded to a thicker substrate 530 having a thickness of d2 to sustain the mechanical strength during handling and processing. Preferably, the thickness of d1 is about 50 um to about 300 um. The bonded area 521 is formed by the wafer layer 510 bonding to the patterned oxide layer 540. The unbonded area 522 results from the lack of an oxide layer. A chip 520, or die, is formed in the thin wafer layer 510 within the unbonded area. However, it should be noted that the wafer layer 510 may be silicon, germanium, gallium arsenide, CdSe, a compound of a Group II element and a Group VI element, or a compound of a Group III element and a Group IV element. A partial wafer dicing technique may be performed by forming a photoresist mask 500 on top of the thin wafer layer 510 and exposing the photoresist mask 500 by lithography. After the photomask 500 is defined, a dry or wet etching process is carried out to etch the thin wafer layer 510. Alternatively, the partial dicing can also be done using maskless direct laser cutting to detach the chip 520. FIG. 5B shows trenches 550, which are formed by etching through the thin wafer layer 510 to the unbonded area 522 surrounding the chip 520. In FIG. 5C, the chip 520, or die, is removed from the unbonded area 522, thereby forming a pocket 560. A High-density plasma, or reactive ion etch, can be used to etch trench 550 and cut the chip or die effectively. Similarly, a pocket can be formed by removing a dummy chip from the substrate. The depth of the pocket should have substantially the same thickness as the real chip, so that after the chip is mounted, a top surface of the chip will be substantially co-planar with a top surface of the wafer. By performing this method, the package is ready for global chip-to-chip wiring without the need for any further preparation such as planarizing the top surface of the bonded chips.

Figure 6:
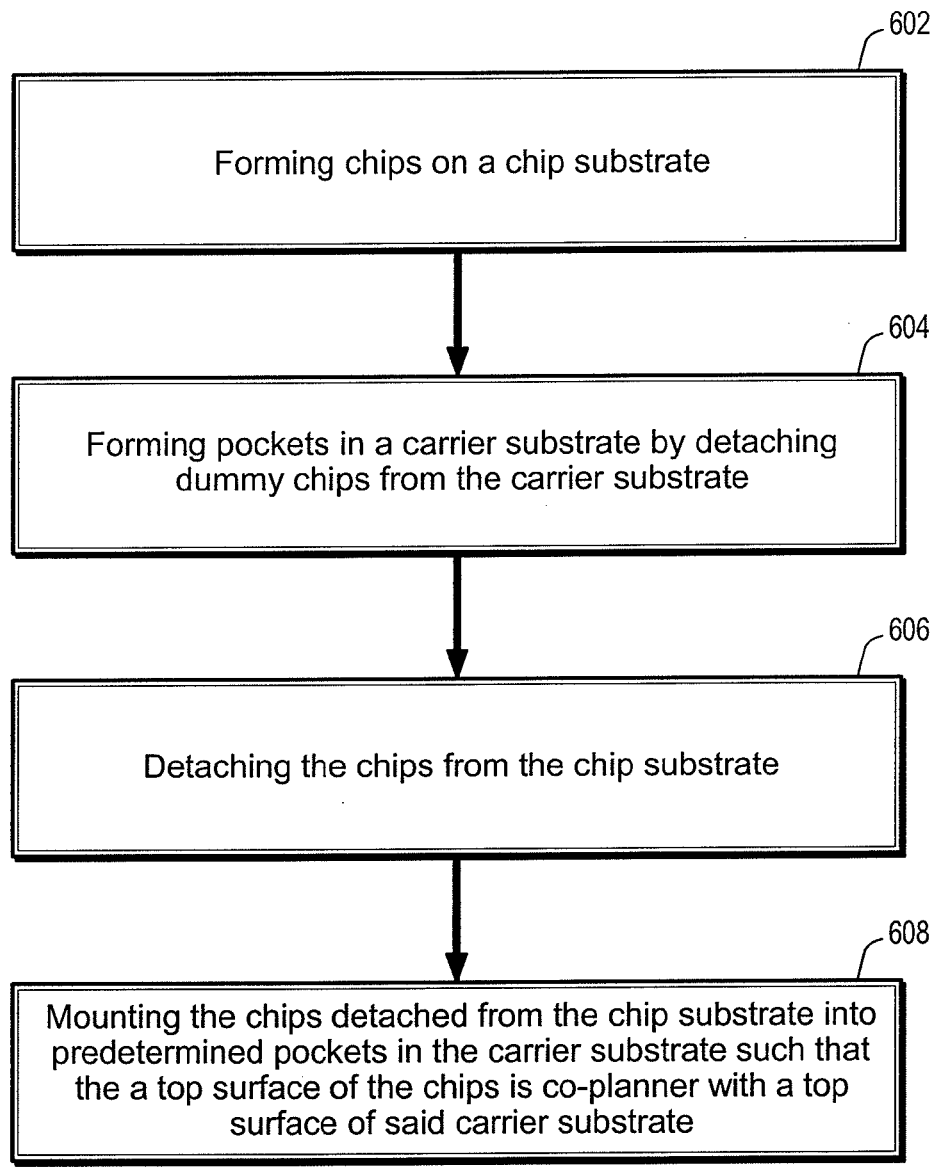
FIG. 6 is a flowchart illustrating a method for forming a multi-chip wafer-level package, according to an exemplary embodiment of the present invention.

Exemplary embodiments of the present invention include methods for forming a multi-chip wafer-level package that facilitate the integration of chips fabricated with different process steps and materials in an economical way. FIG. 6 is a flowchart illustrating a method for forming a multi-chip wafer-level package, according to an exemplary embodiment of the present invention. Now referring to FIG. 6, a plurality of chips is formed on a chip substrate (step 602). Next, pockets are formed in a carrier substrate by detaching dummy chips from the carrier substrate (step 604). Then, the chips are detached from the chip substrate (step 606). It is to be understood that steps 604 and 606 may be performed simultaneously or in a different order. The chips detached from the chip substrate are then mounted into predetermined pockets in the carrier substrate such that a top surface of the chips is substantially co-planar with a top surface of the carrier substrate (step 608).

Figure 7:
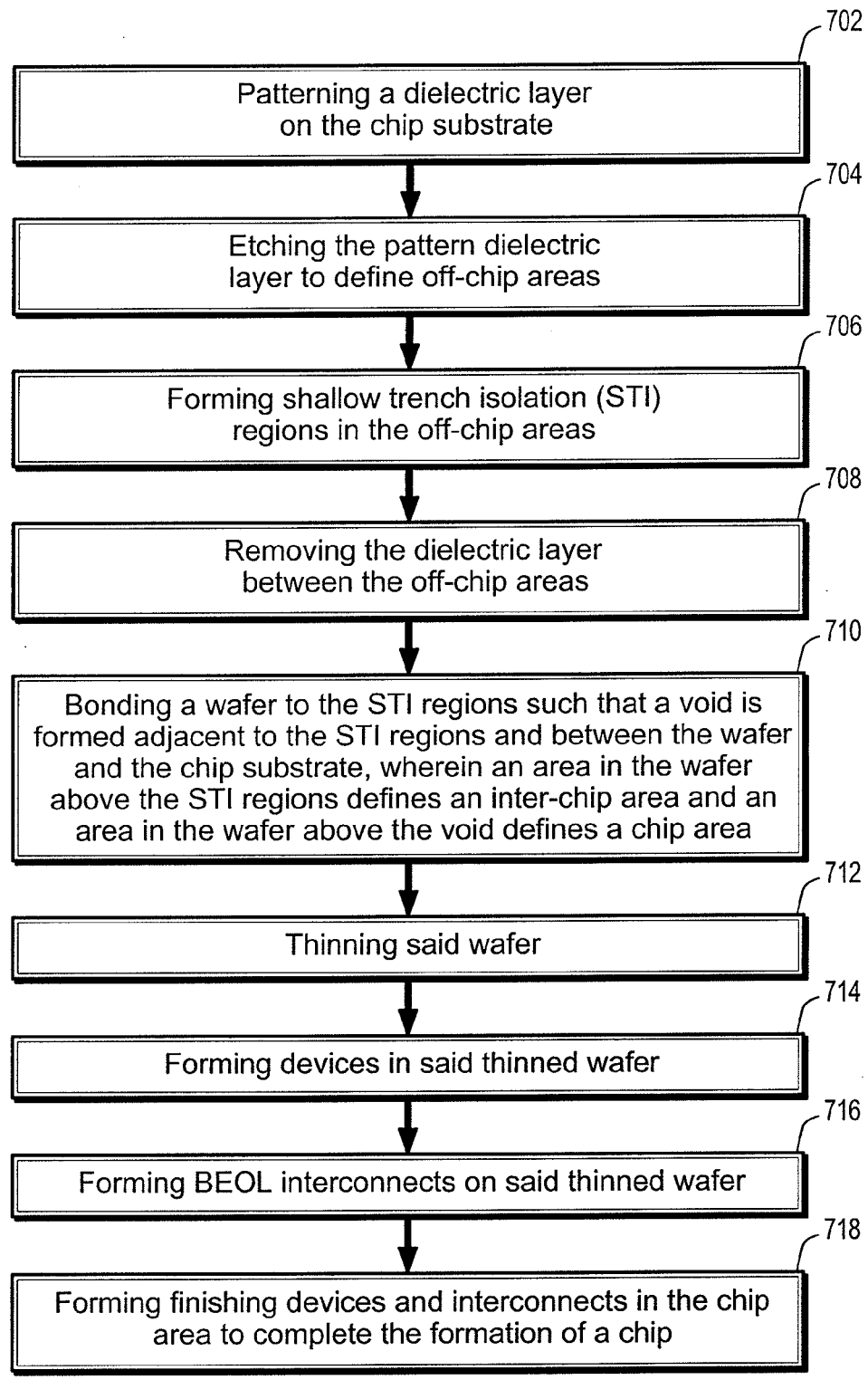
FIG. 7 is a flowchart illustrating a method for forming a plurality of chips on a chip substrate, according to an exemplary embodiment of the present invention.

FIG. 7 is a flowchart illustrating a method for forming a plurality of chips on a chip substrate, according to an exemplary embodiment of the present invention. In particular, FIG. 7 illustrates an exemplary method of step 602 in FIG. 6, which relates to forming chips on a chip substrate. Now referring to FIG. 7, a dielectric layer on a chip substrate is patterned (step 702). Next, the pattern dielectric layer is etched to define off-chip areas (step 704). Shallow trench isolation (STI) regions are formed in the off-chip areas (step 706). Then, the dielectric layer between the off-chip areas is removed (step 708). Next, a wafer is bonded to the STI regions such that a void is formed adjacent to the STI regions and between the wafer and chip substrate, wherein an area in the wafer above the STI regions defines an inter-chip area and an area above the void defines a chip area (step 710). Then, the wafer is thinned (step 712). Devices are then formed in the thinned wafer (step 714). Next, BEOL interconnects are formed on the thinned wafer having devices formed therein (step 716). Finally, finishing devices and interconnects are formed in the chip area of the thinned wafer to complete the formation of a chip (step 718). Further, it is to be understood that the process described above may be employed to form many different types of chips on different chip substrates.

Figure 8:
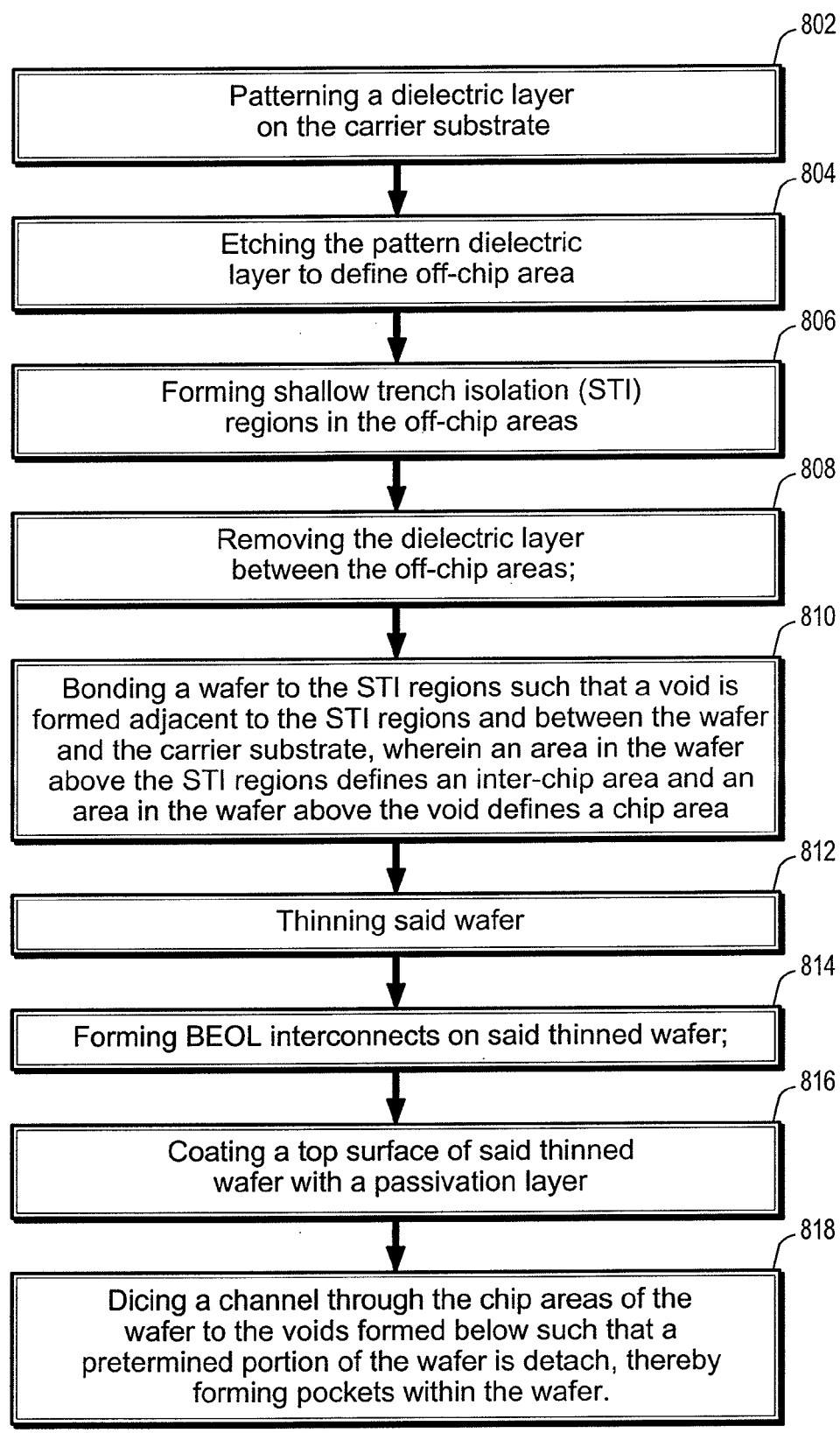
FIG. 8 is a flowchart illustrating a method for forming a plurality of pockets in a chip carrier substrate, according to an exemplary embodiment of the present invention.

FIG. 8 is a flowchart illustrating a method for forming a plurality of pockets in a carrier substrate, according to an exemplary embodiment of the present invention. In particular, FIG. 8 illustrates an exemplary method of step 604 in FIG. 6, which relates to forming pockets in a carrier substrate. Now referring to FIG. 8, a dielectric layer on the carrier substrate is patterned (step 802). Next, the pattern dielectric layer is etched to define off-chip areas (step 804). Then, shallow trench isolation (STI) regions are formed in the off-chip areas (step 806). The dielectric layer is then removed between the off-chip areas (step 808). Next, a wafer is bonded to the STI regions such that a void is formed adjacent to the STI regions and between the wafer and the carrier substrate, wherein an area in the wafer above the STI regions defines an inter-chip area and an area above the void defines a chip area (step 810). Then, the wafer is thinned (step 812). Next, BEOL interconnects are formed on the thinned wafer (step 814). A top surface of said thinned wafer is coated with a passivation layer (step 816). Next, a channel is diced in the chip areas of the wafer such that a predetermined portion, or dummy chip, of the wafer is detach, thereby forming pockets within the wafer (step 818).

Figure 9:
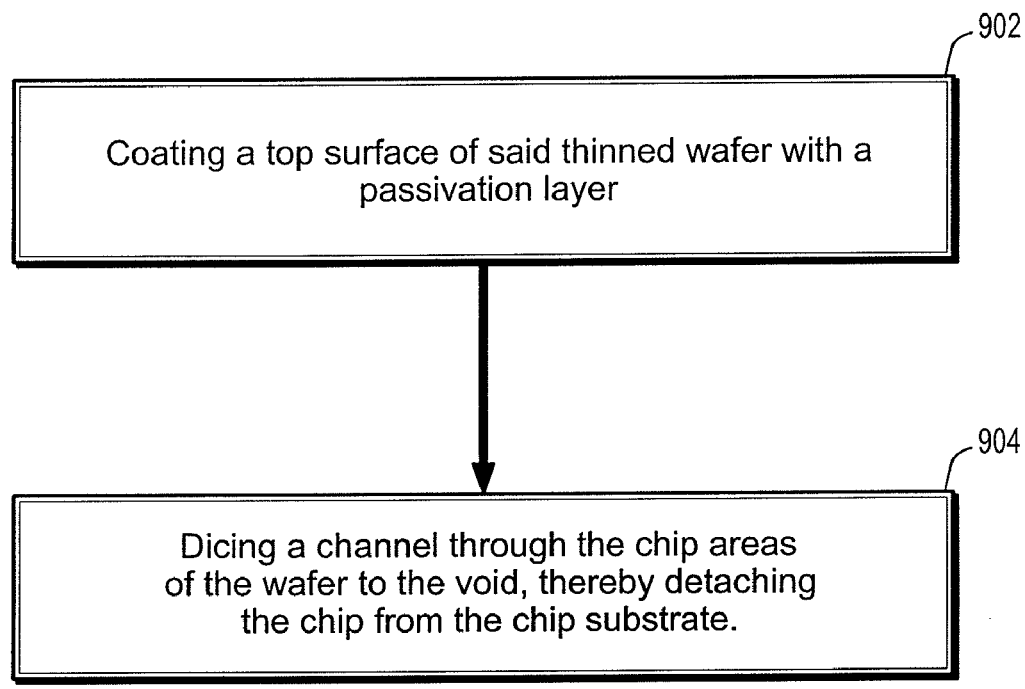
FIG. 9 is a flowchart illustrating a method for detaching a chip from the chip substrate, according to an exemplary embodiment of the present invention.

FIG. 9 is a flowchart illustrating a method for detaching a chip from the chip substrate, according to an exemplary embodiment of the present invention. In particular, FIG. 9 illustrates an exemplary method of step 606 in FIG. 6, which relates to detaching the chips from the chip substrate. Now referring to FIG. 9, a top surface of said thinned wafer is coated with a passivation layer to protect the chip (step 902). Next, a channel is diced through the chip areas of the wafer to the void, thereby detaching the chip from the chip substrate (step 904).

Figure 10:
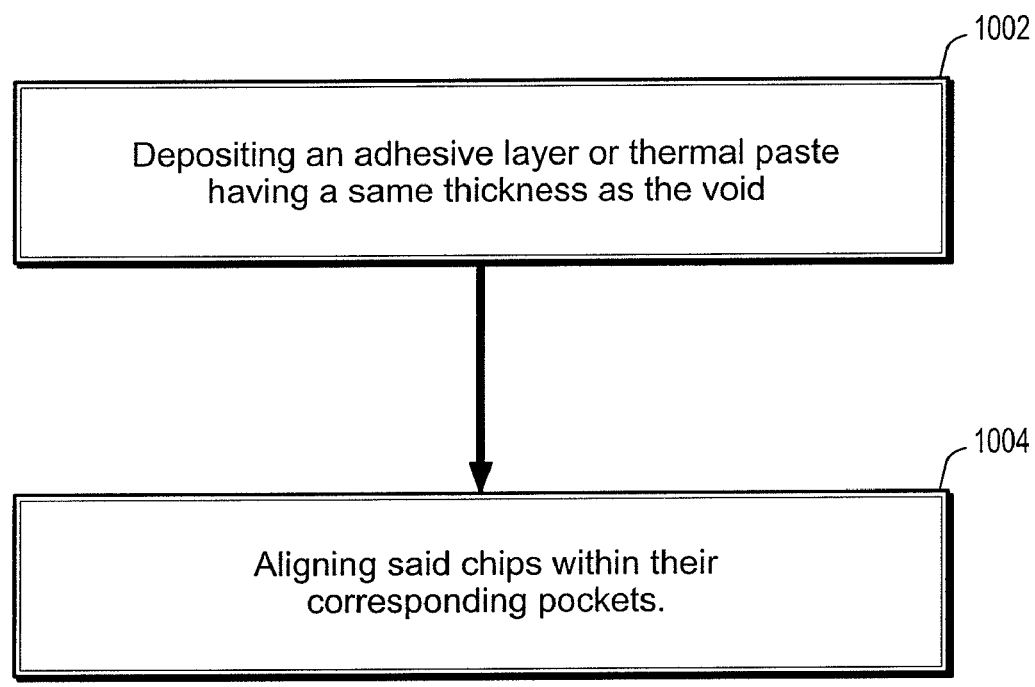
FIG. 10 is a flowchart illustrating a method for mounting a chip detached from the chip substrate into a predetermined pocket in a carrier substrate, according to an exemplary embodiment of the present invention.

FIG. 10 is a flowchart illustrating a method for mounting a chip detached from the chip substrate into a predetermined pocket in a carrier substrate, according to an exemplary embodiment of the present invention. In particular, FIG. 10 illustrates an exemplary method of step 608 in FIG. 6. Now referring to FIG. 10, an adhesive layer or thermal paste having a same thickness as the void is deposited in a bottom portion of the pocket (step 1002). Next, the chips are placed and aligned within their corresponding pockets (step 1004). Further, a dielectric layer having the same dimensions as the void may be used in lieu of the adhesive layer or thermal paste.

In summary, exemplary embodiments of the present invention provide efficient methods for forming a co-planar multi-chip wafer-level package where partial wafer bonding and partial wafer dicing techniques are used to create chips as well as pockets at a surface of a wafer. The finished chips are mounted in the corresponding pockets of a wafer, and global interconnects among the chips are formed on the top planar surface of bonded chips. These methods facilitate the integration of chips fabricated with different process steps and materials. There is no need to use a harsh planarization process such as chemical-mechanical polish to planarize the top surfaces of the chips. Since the chips are precisely aligned to each other and all the chips are mounted facing up, the module is ready for global wiring, which eliminates the need to flip the chips from an upside-down position.

While the present invention has been particularly shown and described with reference to the exemplary embodiments thereof. It will be understood by those of ordinary skill in the art that various changes in form and detail may be made therein without departing from the spirit and scope of the present invention as defined by the following claims.

What is claimed is:

1. A method for forming a multi-chip wafer-level package, comprising:
    forming a plurality of different-type chips on a plurality of chip substrates, wherein each of the plurality of chip substrates is used to form only one-type of chip;
    detaching said plurality of different-type chips from said plurality of chip substrates;
    forming pockets in an interconnect layer formed on a carrier substrate, wherein each of the pockets holds one of the different-type chips, wherein the pockets are formed between portions of the interconnect layer bonded at oxide sites of the carrier substrate and wherein the oxide sites have an upper surface disposed higher than an upper surface of the carrier substrate at non-oxide areas; and
    mounting said plurality of chips into their corresponding pockets in the carrier substrate such that a top surface of said plurality of chips is substantially co-planar with a top surface of the carrier substrate.

2. The method of claim 1, wherein the step of forming pockets in the carrier substrate comprises the step of:
    bonding the interconnect layer to the carrier substrate such that voids are formed adjacent to the oxide sites and between the interconnect layer and the carrier substrate, wherein areas in the interconnect layer above the voids define chip areas.

3. The method of claim 2, wherein the step of mounting the plurality of chips into their corresponding pockets comprises the steps of:
    depositing a dielectric layer in the chip areas having a substantially same thickness as the voids; and
    aligning the plurality of chips within their corresponding pockets.

4. The method claim 3, further comprising depositing an insulating layer on the carrier substrate to hold the plurality of chips in place.

5. The method of claim 2, wherein the step of mounting said plurality of chips into their corresponding pockets comprises the steps of:
    depositing an adhesive layer or thermal paste in the chip areas having a substantially same thickness as the voids; and
    aligning said plurality of chips within their corresponding pockets.

6. A method for forming a multi-chip wafer level package, comprising the steps of:
    forming shallow trench isolation (STI) regions on a surface of a chip substrate;
    partially bonding a wafer to the chip substrate via the STI regions such that voids are formed adjacent to the STI regions in non-bonded regions between the wafer and the chip substrate, wherein areas in the wafer above the STI regions define inter-chip areas and areas in the wafer above the void define chip areas and buffer regions around the chip areas;
    thinning the wafer;
    forming devices in the chip areas of the thinned wafer;
    forming interconnects on the thinned wafer; and
    forming finishing devices and interconnects in the chip areas to complete the formation of a plurality of chips.

7. The method of claim 6, further comprises the step of detaching said plurality of chips from the chip substrate.

8. The method of claim 7, wherein the step of detaching said plurality of chips from the chip substrate comprises the steps of:
    coating a top surface of said thinned wafer with a passivation layer; and
    dicing a channel through the buffer regions of said thinned wafer to the voids, thereby detaching said plurality of chips from said plurality of chip substrates.

* * * * *